REVERSIBLE COUNTER STAGE

Filed April 23, 1964 3 Sheets-Sheet 1

INVENTOR.
MILTON L. NOBLE
BY
[signature]
ATTORNEY

REVERSIBLE COUNTER STAGE

Filed April 23, 1964 3 Sheets-Sheet 2

INVENTOR.
MILTON L. NOBLE

BY

Arthur L. Collins

ATTORNEY

INVENTOR.
MILTON L. NOBLE
BY
Arthur L. Collins
ATTONEY 3,263,097

REVERSIBLE COUNTER STAGE

Milton L. Noble, Liverpool, N.Y., assignor, by mesne assignments, to the United States of America as represented by the Secretary of the Navy Filed Apr. 23, 1964, Ser. No. 362,213
2 Claims. (Cl. 307—88.5)

The present invention relates to novel and improved electronic counting apparatus and more particularly to a novel and improved reversible binary counter which automatically provides an accumulated algebraic sum of add and subtract pulses received on separate input lines.

Reversible counting devices have been devised in the past by providing suitable logic circuitry which follow the rules of binary addition and subtraction between the individual stages of conventional non-reversible counters. Modified reversible counters of this type generally employ a master flip-flop circuit which pre-conditions the various individual flip-flop stages of the counter for addition or subtraction. The incoming addition and subtraction pulses then energize the first flip-flop stage, and succeeding stages of the counter successively energize one another depending upon the direction in which the preceding flip-flop switches and upon the state of the master flip-flop circuit. Considerable difficulty has been experienced heretofore, however, in the use of conventional counters modified in this way, particularly where large multi-stage counters are involved and stage propagation time and pulse repetition rates are critical.

It is therefore a principal object of the invention to provide a novel and improved binary counter which can be subjected to extreme operating conditions without reducing its reliability.

It is a further object of the invention to provide a novel and improved reversible binary counting device having a propagation time which is substantially independent of loading conditions.

It is a further object of the invention to provide a novel and improved reversible binary counter in which each stage is a separate entity such that as many may be interconnected as may be desired.

Figure 1:
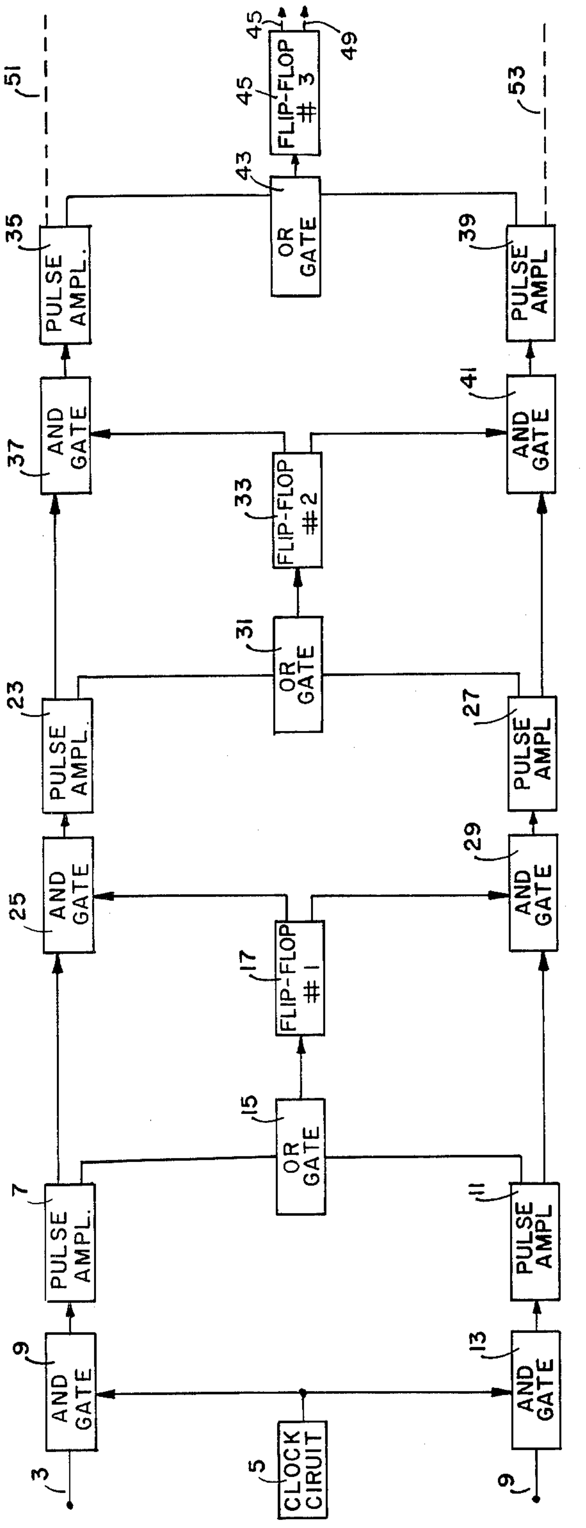
Figure 2A:
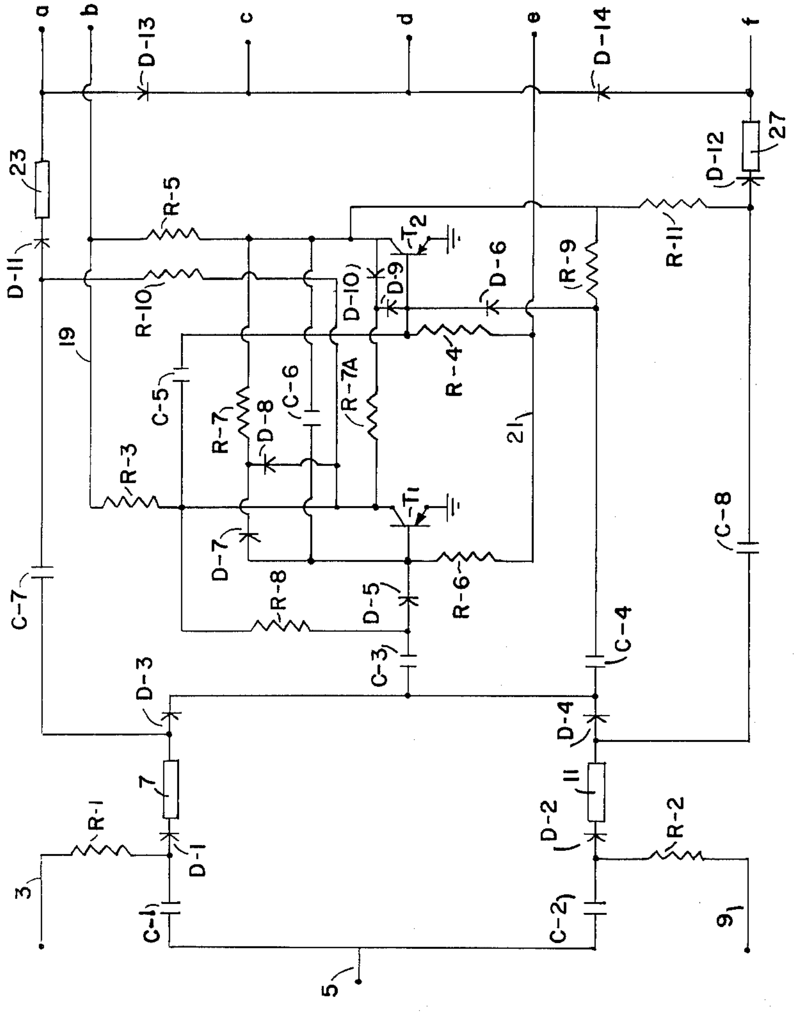
Figure 2B:
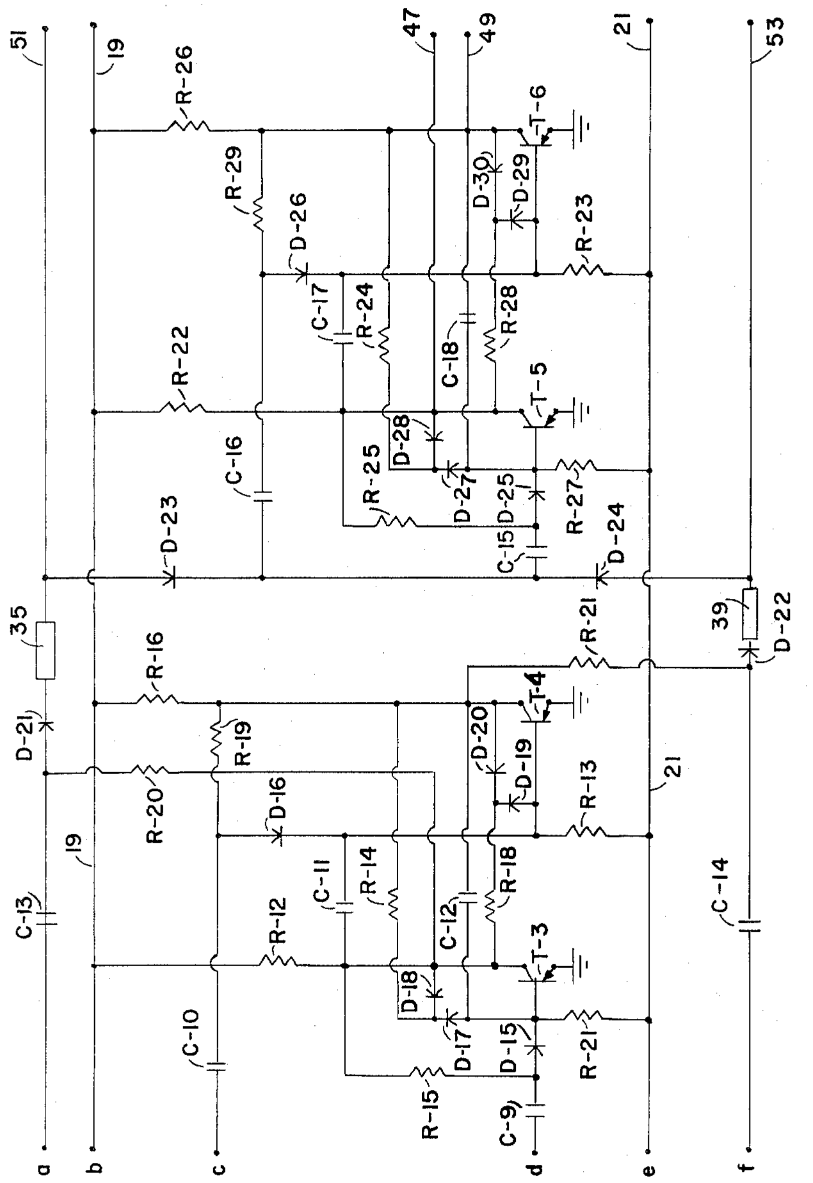

Other objects and many of the attendant advantages of this invention will be readily appreciated as the same becomes better understood by reference to the following detailed description when considered in connection with the accompanying drawing wherein:

FIG. 1 is a diagrammatic view of a preferred embodiment of the present invention; and FIGS. 2A and 2B are a detailed schematic view of the invention shown in FIG. 1.

Referring now to the drawing, it will be noted that pulses on input conductor 3, which are to be added in the counter circuitry of the present invention and which are preferably positive in polarity, are coupled to the pulse amplifier 7 through resistor R-1 and diode D-1 of AND circuit 9. Pulses from the clock circuit 5 are also coupled to the pulse amplifier 7 through condenser C–1 and diode D–1 of AND circuit 9. Similarly, pulses on input conductor 9, which are to be subtracted in the counter circuitry and which are preferably positive in polarity, are coupled to the pulse amplifier 11 through resistor R-2 and diode D-2 of AND circuit 13. Pulses from the clock circuit 5 are also coupled to the pulse amplifier 11 through condenser C–2 and diode D–2 of AND circuit 13. Output circuits of pulse amplifiers 7 and 11 are coupled to the base of transistor $T_1$ through diodes D–3 and D–4 of OR circuit 15, condenser C–3 and diode D–5. Output circuits of pulse amplifiers 7 and 11 are also coupled to the base of transistor $T_2$ through diodes D–3 and D–4 of OR circuit 15, condenser C–4, and diode D–6.

Transistors T–1 and T–2 and their associated circuits act as the counter's first flip-flop circuit 17, the state of which, as will be more apparent hereinafter, represents the least significant bit of the stored binary number. The emitter-collector circuit of transistor T–1 extends from the negative voltage power supply line 19 through resistor R–3 and the transistor to ground. The collector of transistor T–1 is coupled to the base of transistor T–2 through condenser C–5 and the base of transistor T–2 is connected to the positive bias supply line 21 through resistor R–4. The emitter-collector circuit of transistor T–2 extends from the positive voltage supply line 19 through resistor R–5 and the transistor to ground. The collector of transistor T–2 is coupled to the base of transistor T–1 through condenser C–6 and the base of transistor T–1 is connected to the positive bias supply line 21 through resistor R–6. The base and collector of transistor T–1 are respectively connected to the collector of transistor T–2 through diode D–7 and diode D–8 and resistor R–7. The base and collector of transistor T–2 are respectively connected to the collector of transistor T–1 through diode D–9 and diode D–10 and resistor R–7A. The collector of transistor T–1 is also coupled to the junction of condenser C–3 and diode D–5 through resistor R–8 and the collector of transistor T–2 is coupled to the junction of condenser C–4 and diode D–6 through resistor R–9.

The output circuit of pulse amplifier 7 is coupled to the pulse amplifier 23 through condenser C–7 and diode D–11 of AND circuit 25. The collector of transistor T–1 is also coupled to the pulse amplifier 23 through resistor R–10, and diode D–11 of AND circuit 25. Similarly, the output circuit of pulse amplifier 11 is coupled to pulse amplifier 27 through condenser C–8 and diode D–12 of AND circuit 29. The collector of transistor T–2 is also coupled to pulse amplifier 27 through resistor R–11, and diode D–12 of AND circuit 29. Output circuits of pulse amplifiers 23 and 27 are coupled to the base of transistor T–3 through diodes D–13 and D–14 of OR circuit 31, condenser C–9 and diode D–15. Output circuits of pulse amplifiers 23 and 27 are also coupled to the base of transistor T–4 through diodes D–13 and D–14 of OR circuit 31, condenser C–10 and diode D–16.

Transistors T–3 and T–4 and their associated circuits act as the second flip-flop circuit 33 of the counter, the state of which, as will be more apparent hereinafter, represents the next least significant bit of the stored binary number. The emitter-collector circuit of transistor T–3 extends from the power supply line 19 through resistor R–12 and the transistor to ground. The collector of transistor T–3 is coupled to the base of transistor T–4 through condenser C–11 and the base of transistor T–4 is connected to the positive bias supply line 21 through resistor R–13. The base and collector of transistor T–3 are respectively connected to the collector of transistor T–4 through diode D–17 and diode D–18 and resistor R–14. The collector of transistor T–3 is also coupled to the junction of condenser C–9 and diode D–15 through resistor R–15. The emitter-collector circuit of transistor T–4 extends from the power supply line 19 through resistor R–16 and the transistor to ground. The collector of transistor T–4 is coupled to the base of transistor T–3 through condenser C–12 and the base of transistor T–3 is connected to supply line 21 through resistor R–21. The base and collector of transistor T–4 are respectively connected to the collector of transistor T–3 through diode D–19 and diode D–20 and resistor R–18. The collector of transistor T–4 is also coupled to the junction of condenser C–10 and diode D–16 through resistor R–19.

The output circuit of pulse amplifier 23 is coupled to pulse amplifier 35 through condenser C–13 and diode D–21 of AND circuit 37. The collector of transistor T–3 is also coupled to pulse amplifier 35 through resistor R–20, and diode D–21 of AND circuit 37. Similarly, the output circuit of pulse amplifier 27 is coupled to pulse amplifier 39 through condenser C–14 and diode D–22 of AND circuit 41. The collector of transistor T–4 is also coupled to pulse amplifier 39 through resistor R–21 and diode D–22 of AND circuit 41. Output circuits of pulse amplifiers 35 and 41 are coupled to the base of transistor T–5 through diodes D–23 and D–24 of OR circuit 43, condenser C–15 and diode D–25. Output circuits of pulse amplifiers 35 and 41 are also coupled to the base of transistor T–6 through diodes D–23 and D–24 of OR circuit 43, condenser C–16 and diode D–26.

Transistors T–5 and T–6 and their associated circuits act as the third flip-flop circuit 45 of the counter, the state of which, as will be more apparent hereinafter, represents the next significant bit of the stored binary number. The emitter-collector circuit of transistor T–5 extends from the power supply line 19 through resistor R–22 and the transistor T–5 to ground. The collector of transistor T–5 is coupled to the base of transistor T–6 through condenser C–17 and the base of transistor T–6 is connected to supply line 21 through resistor R–23. The base and collector of transistor T–5 are respectively connected to the collector of transistor T–6 through diode D–27 and diode D–28 and resistor R–24. The collector of transistor T–5 is also coupled to the junction of condenser C–15 and diode D–25 through resistor R–25. The emitter-collector circuit of transistor T–6 extends from the power supply line 19 through resistor R–26 and the transistor T–6 to ground. The collector of transistor T–6 is coupled to the base of transistor T–5 through condenser C–18 and the base of transistor T–5 is connected to supply line 21 through resistor R–27. The base and collector of transistor T–6 are respectively connected to the collector of transistor T–5 through diode D–29 and diode D–30 and resistor R–28. The collector of transistor T–6 is also coupled to the junction of condenser C–16 and diode D–26 through resistor R–29. Although only three stages of the counter are shown herein, it is to be understood that the output circuits 47 and 49 of transistors T–5 and T–6 and the output circuits 51 and 53 of amplifiers 35 and 39 may be coupled to as many similar successive cascaded stages of the counter as may be desired.

In describing the operation of the above described counter, it will be assumed that each component transistor flip-flop circuit occupies its "1" state when its odd-numbered transistor T–1, T–3 or T–5 is conducting and its "0" state when its even numbered transistor T–2, T–4 or T–6 is conducting. It will also be assumed that before a pulse is received on either input line, transistors T–2, T–3 and T–6 are conducting so that prior to energization, the binary reading on the counter is 010.

When a positive pulse is received on input line 3, which is to be additively recorded on the counter, it, together with the pulse from the clock circuit 5, pulses amplifier 7 and this pulse is steered to the base of transistor T–2 driving it positive. When this occurs, transistor T–2 is turned off, its collector is driven in a negative direction, and transistor T–1 is turned on by the negative pulse through condenser C–6. The negative level at the collector of transistor T–1, prior to switching, is applied through resistor R–10 to the cathode of diode D–11, and the circuit conditioned or gated such that the incoming pulse from conductor 3 and amplifier 7 is not applied to the base of transistor T–4 or T–5. Thus, when a first positive pulse is applied to conductor 3, it is additively recorded as a binary reading on the counter changes from 010 to 011.

A second pulse applied to conductor 3 is steered to the base of transistor T–1 and drives it positive. When this occurs, transistor T–1 is turned-off, its collector is driven in a negative direction, and transistor T–2 is turned-on. The positive level at the collector of transistor T–1, prior to switching, is applied through resistor R–10 to the cathode of diode D–11. This conditions or gates the base circuit of transistor T–3 for energization. Thus the incoming pulse on conductor 3 is amplified in amplifier 7 and also fed through condenser C–7, diode D–11, amplifier 23, diode D–13, condenser C–9, and diode D–15 to the base of transistor T–3. When this occurs, transistor T–3 is turned-off, its collector is driven in a negative direction, and transistor T–4 is turned-on. The positive level at the collector of transistor T–3, prior to switching, is then applied to the cathode of diode D–21 through resistor R–20. This conditions or gates the base circuit of transistor T–6 for energization. Thus, the output pulse of amplifier 23 is fed through condenser C–13, diode D–21, amplifier 35, diode D–23, condenser C–16 and diode D–26 to the base of transistor T–6. When this occurs, transistor T–6 is turned-off, its collector is driven in a negative direction, and transistor T–5 is turned-on. Thus, the counter additively records the second incoming signal as its binary reading changes from 011 to 100. Successive pulses applied to conductor 3 are additively recorded on the counter in a similar manner.

The counter subtracts incoming pulses or signals on conductor 9 in a manner similar to that in which signals applied to conductor 3 are added. Thus, with each incoming pulse on conductor 9, the state of the first stage of the counter, which includes transistors T–1 and T–2 and their associated circuits, is always reversed. Successive stages of the counter are then triggered and switched when transistors T–2, T–4 or T–6 of the preceding stage are deenergized. In this way, as was the case when incoming pulses on conductor 3 are additively accumulated, the rules of binary logic are followed and incoming pulses on conductor 9 are subtracted from the binary total recorded on the counter.

It is to be understood that although only three stages of the improved counter have been described hereinabove, any greater number of stages could be connected in cascade with conductors 47, 49, 51 and 53 without departing from the spirit or scope of the present invention.

Obviously, many modifications and variations of the present invention are possible in the light of the above teachings. It is therefore to be understood that within the scope of the appended claims, the invention may be practiced otherwise than as specifically described.

What is claimed is:

1. A binary counter comprising:
(a) a first source of electrical pulses which are to be additively accumulated in the counter;
(b) a second source of electrical pulses which are to be subtracted from the accumulation of the counter;
(c) a first transistorized flip-flop circuit;
(d) means for coupling both said sources to both base input circuits of the first flip-flop circuit;
(e) a second transistorized flip-flop circuit;
(f) means including a capacitor and a series-connected diode for coupling the first source to the input circuit of the second transistorized flip-flop circuit;
(g) means including a resistor for connecting one collector of the first transistorized flip-flop circuit to the junction of the series-connected capacitor and diode;
(h) means including another capacitor and series-connected diode for coupling the second source to the input circuit of the second transistorized flip-flop circuit; and
(i) means including another resistor for connecting the other collector of the first transistorized flip-flop circuit to the junction of the said other series-connected capacitor and diode.

2. A binary counter comprising:
(a) a first source of electrical pulses which are to be additively accumulated in the counter;
(b) a second source of electrical pulses which are to be subtracted from the accumulation of the counter;
(c) a first transistorized flip-flop circuit;
(d) means for coupling both said sources to both base input circuits of the first flip-flop circuit;
(e) a second transistorized flip-flop circuit;
(f) means including a capacitor and a series-connected diode for coupling the first source to the input circuit of the second transistorized flip-flop circuit;

(g) means including a resistor for connecting one collector of the first transistorized flip-flop circuit to the junction of the series-connected capacitor and diode;

(h) means for amplifying the pulse from the first source applied to the input circuit of the second flip-flop circuit;

(i) means including another capacitor and series-connected diode for coupling the second source to the input circuit of the second transistorized flip-flop circuit;

(j) means including another resistor for connecting the other collector of the first transistorized flip-flop circuit to the junction of the said other series-connected capacitor and diode;

(k) means for amplifying the pulse from the second source applied to the input circuit of the second flip-flop circuit.

References Cited by the Examiner

UNITED STATES PATENTS

| | | | |
|---|---|---|---|
| 2,656,106 | 10/1953 | Stabler | 328—44 X |
| 2,735,005 | 2/1956 | Steele | 328—44 |
| 2,999,207 | 9/1961 | Quynn | 328—44 |

ARTHUR GAUSS, *Primary Examiner.*

S. D. MILLER, *Assistant Examiner.*